United States Patent [19]

Sevenhans et al.

[11] Patent Number: 4,658,281
[45] Date of Patent: Apr. 14, 1987

[54] RADIATION-SENSITIVE SEMICONDUCTOR DEVICE

[75] Inventors: Johannes M. Sevenhans, Brasschaat; Gilbert J. Declerck, Herent, both of Belgium

[73] Assignee: Agfa-Gevaert N.V., Mortsel, Belgium

[21] Appl. No.: 627,659

[22] Filed: Jul. 3, 1984

[30] Foreign Application Priority Data

Jul. 6, 1983 [EP] European Pat. Off. ........ 83201004.5

[51] Int. Cl.$^4$ ...................... H01L 27/14; H01L 27/02
[52] U.S. Cl. .......................................... 357/30; 357/29; 357/32; 357/45; 357/47; 357/24
[58] Field of Search ................. 357/29, 30, 32, 45, 357/47–51, 24 LR; 358/212

[56] References Cited

U.S. PATENT DOCUMENTS 4,236,168 11/1980 Herbst .................................. 357/30

FOREIGN PATENT DOCUMENTS 0077003 4/1983 European Pat. Off. ........... 357/30

Primary Examiner—James W. Davie
Assistant Examiner—Georgia Y. Epps
Attorney, Agent, or Firm—William J. Daniel

[57] ABSTRACT

A radiation-sensitive semiconductor device, e.g., a line imager, wherein a plurality of closely spaced photodiodes (10) are electrically insulated from each other by depletion regions. The device is provided with storage means (18, 19) for collecting into packets the minority charges generated in each diode during a certain integration time and with transfer means (12, 13) for transferring the distinct charge carrier packets to read out means (15), whereby improved performance with respect to blooming between adjacent diodes is obtained.

7 Claims, 12 Drawing Figures

RADIATION-SENSITIVE SEMICONDUCTOR DEVICE

BACKGROUND OF THE INVENTION

1. Field of the Invention:

The present invention relates to a radiation-sensitive semiconductor device comprising a semiconductor body which at its surface has distinct radiation-sensitive diodes, and the invention relates in particular to a high resolution semiconductor line imager.

2. Description of the Related Art:

Radiation-sensitive semidconductor devices of the above-mentioned kind are used, for example, in photosensitive circuits for track following or positioning of light beams, and in image scanners wherein an image is line-wise scanned by means of a device comprising a great plurality of line-wise arranged photo-diodes that cover the width of the image to be scanned. In these semiconductor devices, the minority charge carriers that are generated in the diodes upon exposure to radiation produce corresponding voltages that form the output signal of the device.

There exists a problem in these devices in achieving effective mutual isolation of signal charges generated in adjacent diodes. As a matter of fact, the thus generated minority charge carriers must be confined in the lateral direction, i.e. in the direction of one diode towards an adjacent diode, in order to avoid cross-talk between adjacent diodes.

One technique for solving the problem comprises providing a sufficiently large spatial separation between the diodes and the associated depletion regions so that charge carriers which are generated in or near the depletion region of a particular diode do not contribute to the photoelectric current through an adjacent diode. However, such a spatial separation is at the sacrifice of the resolving power of the device.

In the FR Pat. Publication No. 2,367,353 there is disclosed a radiation sensitive line imager that comprises a multiplicity of line-wise arranged photodiodes that are formed by the suitable doping of local areas of a semi-conductor surface. The areas are electrically insulated from each other by oppositely doped intervening areas. These intervening oppositely doped areas make it necessary to increase the distance between the photo-sensitive areas, and they also increase the cost-price of the manufacturing process of the device.

A radiation-sensitive device in which the distance between adjacent photodiodes can be very small (of the order of a few microns) while the cross-talk is low, is disclosed in GB-A No. 2,080,026. This application discloses a radiation-sensitive semiconductor device comprising a semiconductor body which at a flat surface has a radiation-sensitive diode having two or more sub-elements, in which device depletion regions associated with the sub-elements are formed on applying a reverse voltage across the sub-elements. At least one of the sub-elements has a connection for deriving a signal indicative of radiation-generated current which flows through the sub-element due to the electric field across the depletion regions, and the distances between adjacent sub-elements are sufficiently small that regions between adjacent sub-elements are fully depleted by said depleted regions.

A disadvantage of a device as described in this application is that as a consequence of the galvanic connections with the sub-elements for deriving the corresponding output signals, the minority charge carriers generated in each sub-element upon radiation are instantly carried off, so that the potentials of the sub-elements remain practically equal to each other whereby blooming may rather rapidly occur. Blooming is known in the art, and is a saturation effect wherein excess charges caused by a localized overload diffuse or flow to neighbouring diodes and thereby cause false information signals, causing a spreading of a white area in the display. It is the aim of the present invention to provide a device of the kind described, that shows improved performance with respect to blooming.

SUMMARY OF THE INVENTION

According to the present invention, a radiation-sensitive semiconductor imaging device comprising a semiconductor body which at its surface has distinct radiation-sensitive adjacent diodes, and means for electrically insulating said diodes from each other, is characterised in that said insulation means is formed by depletion regions of the semiconductor body that are produced by the application of a reverse voltage across the diodes, the distances between the diodes being sufficiently small so that regions between adjacent diodes are fully depleted, and that means is provides for causing the potentials of the diodes to adjust themselves in accordance with the amount of charge that is being produced during the exposure, thereby to cause a relative displacement of the potential levels of unequally irradiated photodiodes so that the blooming potential ($V_{mb}$) of the device amounts to four times the maximum potential ($V_{mo}$) of the potential hump ($V_m$) between two depleted adjacent photodiodes.

The term "hump" has a descriptive meaning and points to the deformation of the interface potential which impedes the free transfer of minority charge carriers. This term should be understood in connection with the graphic representation of the potentials in the semi-conducton substrate wherein the photodiodes are formed. This being so, it will be seen from the further description of the specification that the potential "hump" is in fact a decrease of the potential level in the region between two adjacent photodiodes.

The mutual isolation of the photodiodes formed on the semi-conductor substrate does not require any manufacturing step in addition to the basic step that is required for the formation of the photodiodes themselves. The formation of the photodiodes occurs as known in the art by providing the semi-conductor substrate with an appropriate mask according to photolithographic techniques, and carrying out surface implantations in the substrate through openings of the mask, of a conductor type opposite to the conductor type of the substrate, thereby to form photosensitive p-n junctions.

The storage means is preferably formed by storage gates that are provided on the semiconductor body of the semiconductor device, and these storage gates are formed by MOS (metal-oxide-silicon) capacitors that comprise a common electrode strip that extends on top of the semiconductor device alongside the distinct diodes. The MOS capacitors are an excellent means for the mutually isolated storage of the distinct charge packets, and the provision of a common electrode permits the simultaneous transfer of the charge packets to a further processing stage.

The transfer means can likewise be in the form of MOS capacitors that comprise a common electrode strip that extends parallel with the storage gate electrode strip, and the read-out means can be CCD (charge-coupled-device) shift registers formed integrally on the semiconductor substrate. This construction provides a most compact device that readily lens itself to complete production according to integrated circuit techniques, and that thereby may offer a high reliability and an economic costprice.

In a preferred embodiment of the invention, the semiconductor substrate is of the p-type and the photodiode areas are of the n-type. A p-type substrate is advantageous for the formation of CCD-shift registers for reading out the signals from the photodiodes, since the CCD's can in such case be built as n-channel devices to benefit from the higher mobility of electrons.

BRIEF DESCRIPTION OF THE DRAWINGS

The invention will be described hereinafter by way of example with reference to the accompanying drawings wherein.

DETAILED DESCRIPTION OF PREFERRED EMBODIMENT

Figure 1:
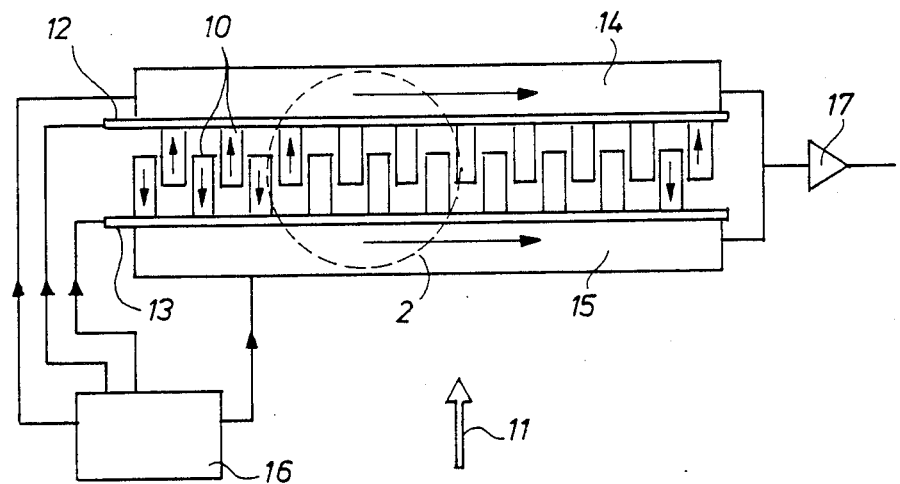
FIG. 1 is a diagrammatic topside representation of one embodiment of a line-imager according to the invention.

FIG. 1 represents diagrammatically a so-called solid state line-imager. The device comprises a multiplicity of sensors 10 arranged in staggered parallel rows and formed by of photodiode junctions in the semi-conductor substrate of a chip. The optical information to be recorded may be projected onto the imager e.g. by means of a lens or mirror system and relative movement between the information carrier and the radiation beam in the direction of the arrow 11 causes the line-wise reading of the image. Incident radiation is transformed as follows into electronic information: photons are absorbed by the semi-conductor material and electron-hole pairs are generated, and the produced minority charge carriers are integrated in corresponding sites of storage gates, and transported as "packets" in parallel, i.e. concurrently with each other, through transfer gates 12 and 13 towards shift registers 14 and 15. The charge packets are serially read-out from the shift registers under the control of a clock generator 16 that controls also the transfer gates, and received in an output stage 17 for amplification of the charge packets. The electric output signal from the stage 17 may be subjected to signal processing such as amplification, compression, coding, etc., before the signal is recorded, transmitted, or directly read out on a display, as the case may be.

The odd sensors of the illustrated imager are read out on one side of the sensor array, and the even sensors are read out at the opposite side, as indicated by the small arrows on the sensors. In this way, the pitch i.e., the separation distance, between the channels of the storage gates, the transfer gates and the cells of the CCD registers is twice what it would be if all sensors were connected to one or two registers arranged on one side of the sensor array. A suitable pitch of the transfer channels would correspond with that of the sensors. A common pitch for the sensors is 8 microns and the corresponding pitch for the gates and the register cells is thus 16 microns.

Figure 2:
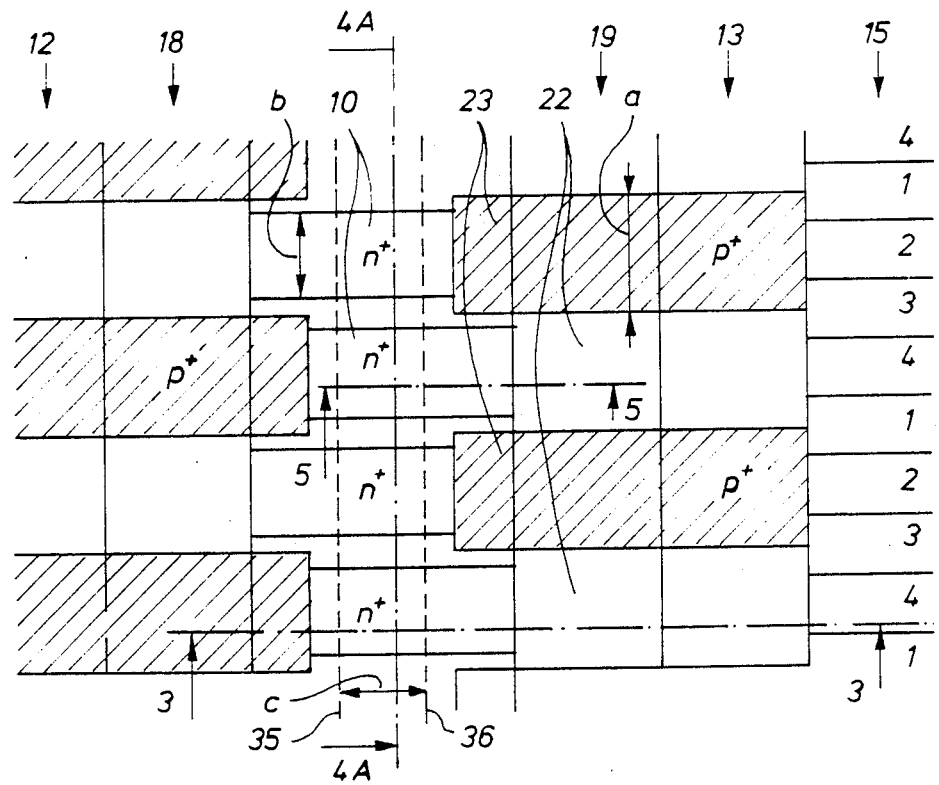
FIG. 2 is an enlarged detail view of the portion generally within the circle 2 of FIG. 1, but rotated 90 degrees around the axis of the circle.

An enlarged and also a more detailed view of the encircled portion 2 of the device of FIG. 1 is shown in FIG. 2. The Figure illustrates only the different functional areas of the silicon substrate, the various electrode structures on top of the substrate having been omitted. The sensors 10 are shown, conducting alternately towards charge storage gates 18 and 19, transfer gates 12 and 13, and shift registers 14 and 15, only the register 15 at the right-hand side of the figure being illustrated. The shift registers may suitably be 4-phase CCD (charge-coulped device) registers comprising four-electrode cells, as indicated by the groups of electrodes 1, 2, 3, 4. A more detailed description of the shift registers and of the transfer gates is believed to be unnecessary for the understanding of the present invention. If desired, reference may be had to the publication entitled entitled "Quadrilinear CCD Imager read out circuitry", published in the Journal: Research Disclosure of May, 1983 under no. 22.943, wherein a detailed description of a CCD shift register related to a line imager has been published.

The sensors 10 are rectangular active n+ areas of a p-type silicon substrate which have been obtained by the implantation of, for instance, phosphor atoms. Typical doping concentrations are $N_D = 1.0 \times 10^6$ atoms per cm3 for the n+ areas, and $N_A = 6.5 \times 10^{14}$ atoms per cm3 for the p-type silicon substrate. The operative length of the photodiodes amounts in fact to the distance c in FIG. 2, since strips (not illustrated in the drawing) of radiation-opaque material, e.g. aluminium, are coated on both sides of the end regions of the diodes, in a direction parallel with that of the row of diodes. The lines 35 and 36 in FIG. 2 indicate the limits of the radiation sensitive zones of the photodiodes in their longitudinal direction.

The areas 23 (shown hatched) are p+-type areas that likewise have been formed by suitable implantation of acceptor atoms in the silicon substrate. A suitable doping concentration for the p+ areas amounts to $N_A = 10^{19}$ atoms per cm3. These areas 23 laterally confine the storage sites 22 of the sensors, which are located at either side of the sensor array and form parts of the channels through which minority charge carriers generated in the photodiodes can be transported towards the read-out shift registers.

The operation of the lateral p+ type confinement areas is based on the fact that these p+ diffusions limit the extension of the potential wells laterally of the channels 22 in the storage gates, 18, 19 and in the transfer gates 12 and 13, since they keep the potential of the oxidesilicon interface near zero.

Figure 3:
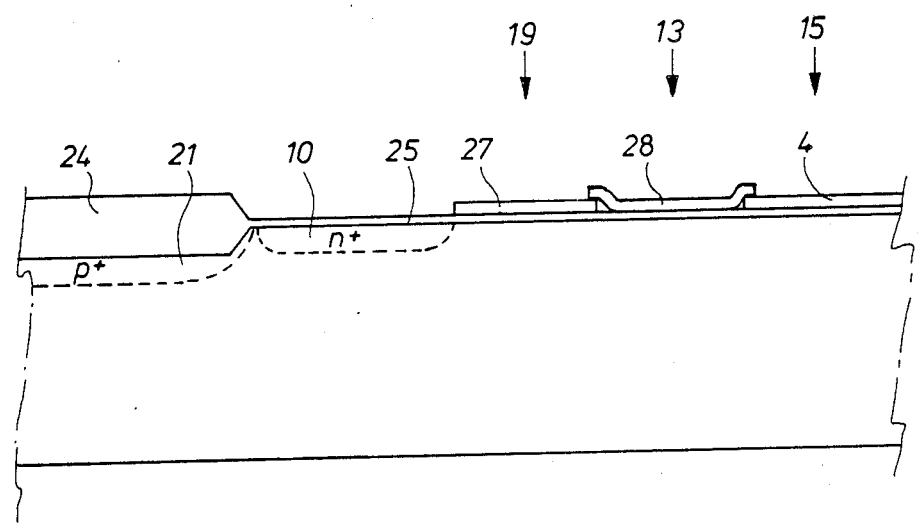
FIG. 3 is a still further enlarged section on line 3—3 of FIG. 3.

A longitudinal section of a sensor on line 3—3 of FIG. 2, is shown in FIG. 3. The storage gate 19 and the transfer gate 13 are in fact MOS capacitors formed by corresponding, mutually insulated electrode strips 27 and 28, that are applied on top of the insulating silicon oxide layer 25 and that extend in a direction parallel to the row of sensors. The CCD shift register 15 is composed of cells that each comprise four MOS capacitors forming electrodes 1, 2, 3 and 4, that are electrically insulated from the substrate 20 and from each other. A material commonly used for the formation of the electrodes is polysilicon. A further isolation is created by thick field areas 24 formed in the insulating layer 25 of silicon oxide that is produced on top of the silicon substrate 20. Typical (approximate) thicknesses are 1 micrometer for the field areas 24, 100 nm for the oxide layer 25, 0.7 micrometer for the n+ photosensitive regions, and 0.5 micrometer for the p+ isolation regions.

The mechanism that is operative to keep the minority charge carriers produced by the photodiodes confined in the lateral direction between the diodes will now be described in detail.

Figure 4A:
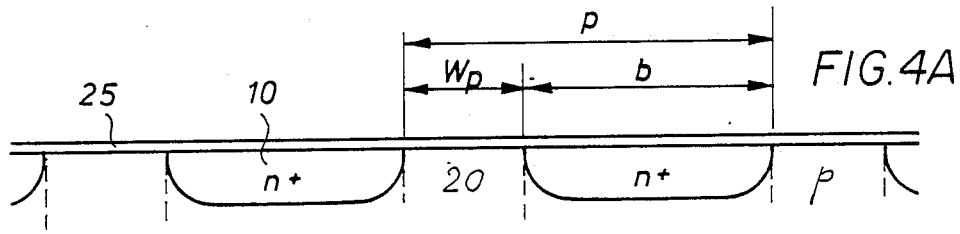
FIG. 4A is a section on line 4A—4A of FIG. 2.

Referring to FIG. 4A which is a transverse cross-section on line 4A—4A of FIG. 2, the photodiodes 10 formed by the n+ areas in the p-substrate 20 have a width b, and a pitch p. In the present embodiment, p=8 um and b=5 um, (um means micrometer).

Figure 4B:
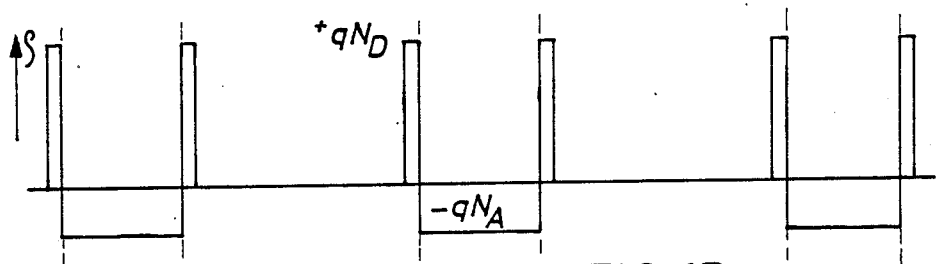
FIG. 4B shows the charge distribution at the silicon/silicon dioxide interface of the section of FIG. 4A.

FIG. 4B represents the charge distribution at the interface of the silicon oxide layer 25 and the silicon substrate 20, at under the operation conditions wherein the interface is entirely depleted at the diode regions.

Figure 4C:
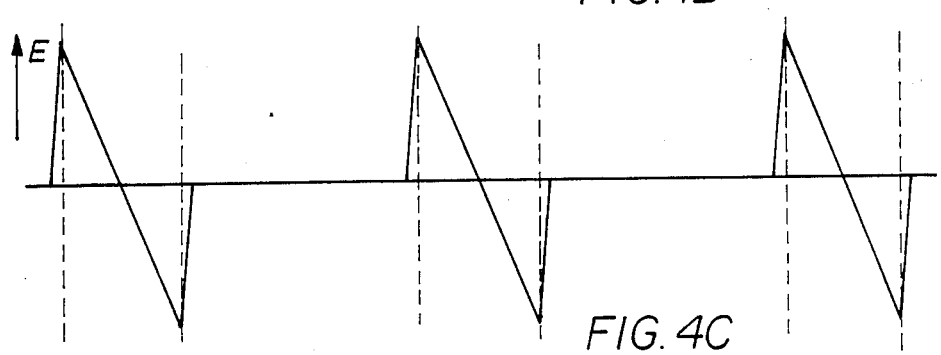
FIG. 4C shows the electric field E at the same location.

FIG. 4C represents the corresponding electric field E in the same interface.

Figure 4D:
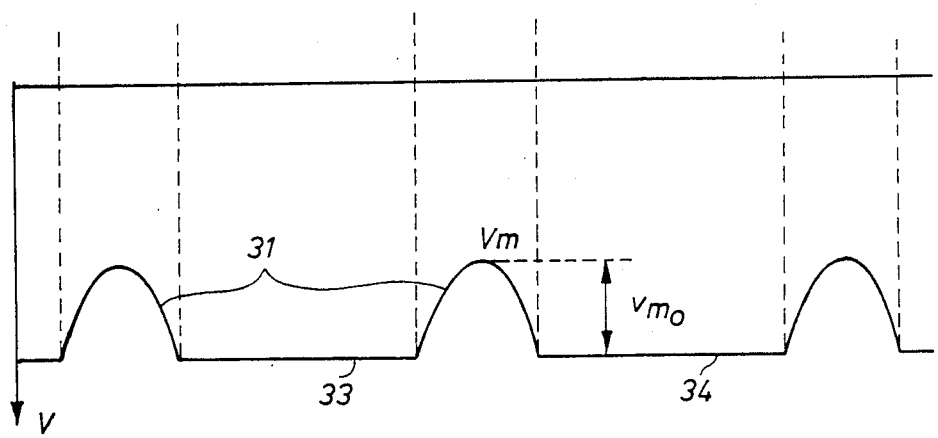
FIG. 4D shows the electric potential level V at the same location.

FIG. 4D represents the electric potential V in the same interface. Increasing positive values of the interface potential are plotted in the downward direction, whereby the limits of the depletion region can be used to depict schematically the walls of an empty well. The potential of the depleted regions below the photodiodes is indicated by the line sections 33, 34 in FIG. 4D, wherein the potential in the substrate region between neighbouring photodiodes is indicated by the humps 31.

Figure 5:
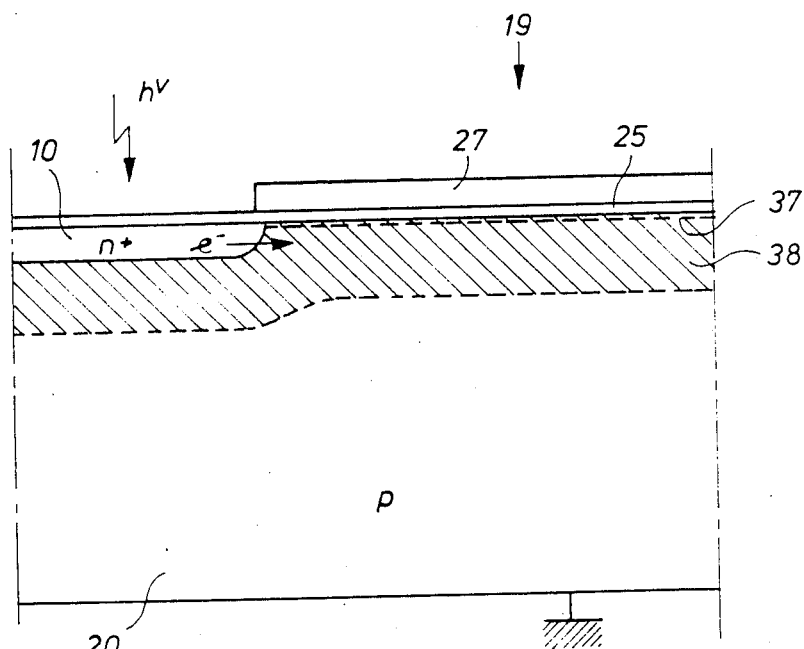
FIG. 5 is an even more enlarged sectional view on line 5—5 of FIG. 2.

Minority charge carriers, i.e., electrons generated near the potential well of the storage gate, under the influence of radiation of the photodiodes, will accumulate at the oxide-silicon interface in an inversion layer of some micrometers in thickness. This has been diagrammaticallly illustrated by the layer 37 in FIG. 5 which shows a greatly enlarged cross-section on line 5—5 of FIG. 2 of a photodiode 10, and its corresponding MOS storage site at the storage gate 19 controlled by the electrode 27. The depletion region 38 in the silicon substrate 20 caused by the photodiode junction and by the biasing of the electrode 27 has been illustrated in an exaggerated way as compared with the thickness of the substrate, by the hatched portion of the figure, and has a thickness in the order of magnitude of 3 um.

The movement of a minority charge carrier e− originating upon exposure of the photodiode to radiant engery h ν (h being Planck's constant, and ν being the frequency of radiation) is illustrated by the corresponding small arrow.

The biasing of the electrode 27 is such that a potential well is formed in the storage gate 19 that is capable of draining the minority charge carriers away from the photodiode site as they are generated so that such carriers are stored during an integration time interval before they are transferred via the transfer gate 13 to the read-out shift register 15. This integration time is in practice the time that is available during a single read-out of the register 15.

Figure 6A:
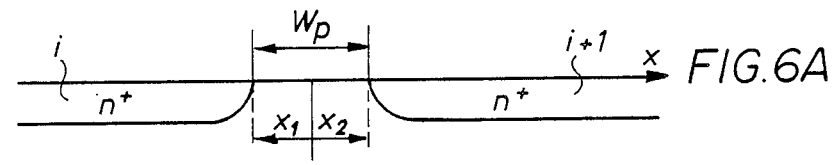
FIG. 6A shows diagrammatically two neighbouring photodiodes.

In a single-sided junction approximation, the potential at a given place x (see FIG. 6A) of the potential hump can be calculated as follows $$V_x = V_m + \frac{q N_A x^2}{2\epsilon_{si}} \quad (1)$$

wherein:
$V_x$ is the potential at a position with abscissa x, x being measured up from the top of the potential hump,
$V_m$ is the top of the potential hump, in fact the minimum potential,
q is the electron charge: $1.6 \times 10^{-19}$ C,
$N_A$ is the doping concentration of the p-type semiconductor expressed in the number of acceptor atoms per cm3 of semi-conductor volume.
$\epsilon_{si}$ is the dielectric constant of silicon.

This approximation is valid since the n+ phosphor concentration in the implanted diodes always exceeds the substrate concentration by a factor 10.

For $W_p = x_1 + x_2$, \quad (2)

wherein $W_p$ is the distance between the boundaries of two photodiodes i and i+1, and $x_1$ is the distance between the top of the potential hump and the boundary of one photodiode i, and $x_2$ is the corresponding distance other boundaries of the other photodiode i+1, the max. potential $V_{mo}$ of the hump, between the two photodiode regions is depleted condition, is as follows:

$$V_{mo} = V_{io} - V_m = V_{i+1,o} - V_m = \frac{q N_A (W_p/2)^2}{2\epsilon_{si}} \quad (3)$$

wherein the index o indicates the depleted condition of the diode regions.

It may be calculated that for $W_p = 3$ um and $N_A = 10^{15}$.cm$^{-3}$; $V_{mo} = 1.103$ V. The potential hump 31 has a symmetric form as illustrated in FIG. 6B, wherein the solid vertical line 32 is the axis of symmetry of the hump, and $x_1 = x_2$.

Figure 6B:
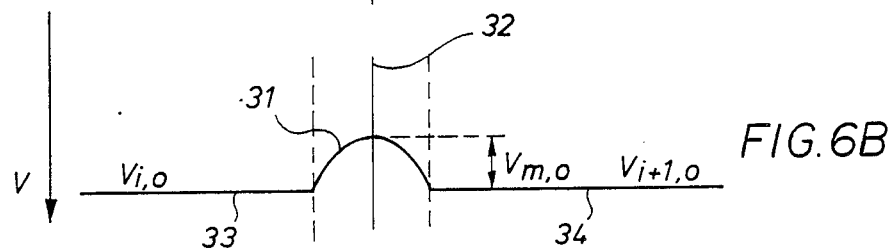
FIG. 6B shows the potential hump $V_m$ between the photodiodes at zero radiation.

If both photodiodes are equally irradiated, the general potential $V_i$ and $V_{i+1}$ represented by the line sections 33 and 34 in FIG. 6B will rise, i.e., increase, but the potential hump 31 changes with such change in the potential levels $V_i$ and $V_{i+1}$, so that the isolation between the two photodiodes remains unaffected by increases in each potential level.

If, on the contrary, both photodiodes are not equally irradiated, there will occur a relative displacement of the potential levels $V_i$ and $V_{i+1}$.

This is possible since the potentials of the diodes are not fixed as is the case of the device of the prior art mentioned in the introduction of this specification but, on the contrary, they are free to adjust themselves in accordance with the amount of charge that is accumulated during the exposure, i.e., the time period which ends with the transfer of the integrated charge packet towards the read-out shift register.

Figure 6C:
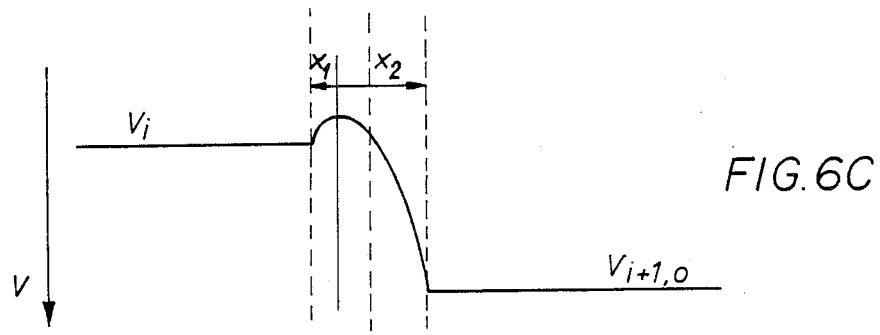
FIG. 6C shows the potential hump $V_m$ between the photodiodes when one diode is exposed almost to saturation, and the other diode is unexposed.

The displacement of the potential levels has been illustrated in FIG. 6C for the photodiode i which is being exposed so that its potential level obtains a level $V_i$, whereas the photodiode $i+1$ remains unexposed and keeps therefore the same depleted potential level $v_{i+1,o}$.

The potential of the potential hump may be written as follows:

$$V_m = V_i - \frac{q N_A^2 x_1^2}{2\epsilon_{si}} \text{ for the photodiode } i \quad (4)$$

and $$V_m = V_{i+1} - \frac{q N_A^2 x_2^2}{2\epsilon_{si}} \text{ for the photodiode } i+1 \quad (5)$$

Finally, the potential difference between both photodiodes may obtain a level where blooming is going to occur.

Figure 6D:
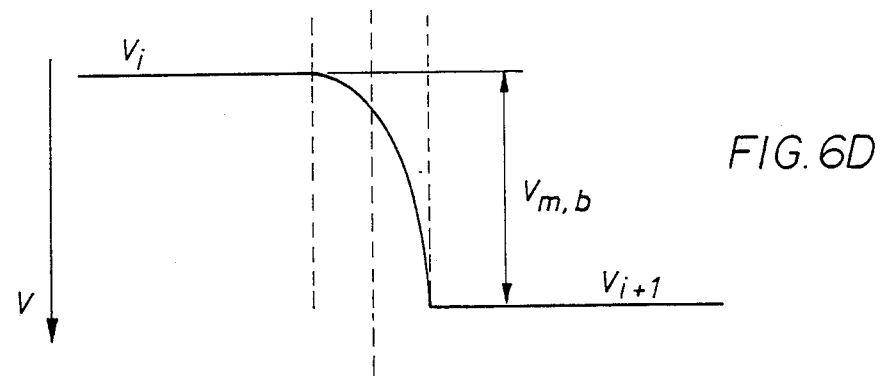
FIG. 6D shows the potential profile between the photodiodes when one diode is exposed to saturation, and the other diode is unexposed.

The situation wherein the potential barrier between two diodes has become unable to arrest charge transfer from one photodiode to the other, has been illustrated in FIG. 6D, wherein the photodiode $V_i$ has been completely loaded, and the diode $i+1$ still operates in the completely depleted state.

The blooming potential $V_{mb}$ is given by:

$$V_{mb} = 4 \cdot V_{mo} = \frac{q \cdot N_A \cdot W_P^2}{2\epsilon_{si}} \quad (6)$$

since Wp, as a whole, is now the distance between the top and the base of the potential hump.

$$\text{Since } V_{mo} = \frac{q \cdot N_A \cdot (W_P/2)^2}{2\epsilon_{si}} = \frac{q \cdot N_A \cdot W_P^2}{2\epsilon_{si} \cdot 4} \quad (3)$$

it follows that $V_{mb} = 4 \cdot V_{mo}$. In the present example, $V_{mb} = 4.412$ V.

It should be understood that the potential of the depletion well of the storage gate that collects the minority charge carriers from the photodiodes should be higher than that of the blooming level, in order to ensure the storage of charge carriers even under conditions close to blooming. In the described embodiment, the electrode 27 of the storage gate 19 was connected to a D.C. potential of +5 Volts.

The advantage of the device is clear: blooming between neighbouring diodes occurs at potential differences between neighbouring photodiodes that are by a factor 4 larger than the initial potential hump $V_{mo}$.

The following data pertain to a particular embodiment of the invention as above described with reference to the drawings:

| | |
|---|---|
| chip length | 15 mm |
| sensor size | 8 × 8 um² |
| number of sensors | 1728 |
| sensor pitch | 8 um |
| responsivity | greater than 0.2 A/W between 400 and 700 nm response range |
| max. responsivity | 0.24 A/W |
| sat. exposure | 2 u J/cm² |
| dark current of the photodiodes | 0.1 pA |
| photoresponse non-uniformity | ±5% |
| output signal at 14 | 1500 mV |
| dynamic range | 60 dB |
| bit rate | 6 MHz |
| clocking of registers 14 and 15 | 4 phase |
| low | 0 V |
| high | 10 V |
| storage gates 18 and 19 | 5 V D.C. |
| transfer gates 12 and 13 | |
| low | 0 V |
| high | 15 V |
| typical integration time of the diodes | 0.288 ms (1728 × 6⁻¹ × 10⁻⁶) |

The invention is not limited to the described embodiment of an opto-electronic sensor device.

The integration of the charges generated upon exposure of the diodes to radiation, need not necessarily occur in MOS storage gates. It is also possible to dispense with the MOS storage gates and to accumulate the charges in an inversion layer of the diodes themselves. Removal of the charge packets at the end of the integration period may occur by closing semi-conductor switches that are provided in the connections of a source of D.C. supply with the surface of the diodes.

The fabrication of the charge coupled devices on the silicon chip may also employ the buried channel technique known in the art, instead of according to the described surface channel techniques.

An opto-electronic sensor device according to the invention may also be arranged as an area image sensor, rather than as a linear image sensor as described hereinbefore. An area image sensor can be formed in a straightforward manner by assembling several linear sensor devices in a two-dimensional array. This array is then provided with an addressing circuit that switches clock pulses to a certain line when its read-out is desired. Other techniques for the formation of an area image sensor are known in the art.

An opto-electronic sensor device according to the invention may comprise more than two staggered parallel rows of photodiodes.

The recording density of the device may even further increased in this way although at the expense of other measures to bring the information from the different rows of sensors "in line".

We claim:

1. A radiation-sensitive semiconductor imaging device comprising: a semiconductor body which at its surface has a plurality of distinct radiation-sensitive adjacent diodes for generating charge carriers when exposed to radiation, means for electrically insulating said diodes from each other comprising depletion regions of the semiconductor body, the distances between the diodes being sufficiently small so that said regions are fully depleted, means for causing the potentials of the diodes to adjust in accordance with the amount of charge that is produced during radiation exposure of said sensors, which includes storage means for each diode for collecting charge carriers generated thereby over a finite period of time into charge carried packets, thereby to cause a relative displacement of the potential levels of unequally irradiated photodiodes so that the blooming potential ($V_{mb}$) of the device amounts to four times the maximum potential ($V_{mo}$) of the potential hump ($V_m$) between two depleted adjacent diodes, charge read-out means, transfer means operable for transporting charge carrier packets into said read-out means, and a controlling clock generator for operating said transfer means to transfer said charge carrier packets into said read-out means.

2. A radiation-sensitive semiconductor device according to claim 1, wherein said storage comprises storage gates that are formed on the semiconductor body of the semiconductor device.

3. A radiation-sensitive semiconductor device according to claim 2, wherein said storage gates are formed by MOS (metal-oxide-silicon) capacitors that comprise a common electrode strip that extends on top of the semiconductor substrate alongside the distinct diodes.

4. A radiation-sensitive semiconductor device according to claim 3, wherein said transfer means are in the form of MOS capacitors that comprise a common electrode strip that extends in parallel with the storage gate electrode strip.

5. A radiation-sensitive semiconductor device according to claim 1, wherein said read-out means are in the form of CCD (charged-coupled-device) shift registers formed integrally on the semi-conductor substrate.

6. A radiation-sensitive semiconductor device according to claim 1, wherein said device is a line imager comprising at least one row of diodes.

7. A radiation-sensitive device according to claim 2, including storage gates at either side of an array of diodes arranged in at least one row, and wherein the charge carrier packets of the odd diodes are stored and transferred on one side of the sensors array, and the charge carrier packets of the even photodiodes are stored and transferred on the other side of such array.

* * * * *